United States Patent
Chen et al.

(10) Patent No.: US 9,508,435 B1
(45) Date of Patent: Nov. 29, 2016

(54) WRITING METHOD FOR RESISTIVE MEMORY APPARATUS

(71) Applicant: Winbond Electronics Corp., Taichung (TW)

(72) Inventors: Frederick Chen, Taichung (TW); Meng-Hung Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/088,138

(22) Filed: Apr. 1, 2016

(30) Foreign Application Priority Data

Jun. 17, 2015 (TW) .............................. 104119566 A

(51) Int. Cl.
*G11C 11/00* (2006.01)
*G11C 13/00* (2006.01)

(52) U.S. Cl.
CPC ......... *G11C 13/0097* (2013.01); *G11C 13/004* (2013.01); *G11C 13/0069* (2013.01); *G11C 2013/0078* (2013.01); *G11C 2013/0092* (2013.01)

(58) Field of Classification Search
CPC ................................................ G11C 13/0069
USPC ......................................................... 365/148
See application file for complete search history.

(56) References Cited

U.S. PATENT DOCUMENTS

| | | | |
|---|---|---|---|
| 8,659,931 B1 | 2/2014 | Ertosun | |
| 8,698,121 B2 | 4/2014 | Phatak et al. | |
| 8,830,724 B2 * | 9/2014 | Chang | G11C 13/0004 365/148 |
| 8,854,874 B2 | 10/2014 | Takashima et al. | |
| 9,349,451 B1 * | 5/2016 | Lin | G11C 13/0097 |
| 2005/0195633 A1 * | 9/2005 | Choi | G11C 13/0004 365/148 |
| 2010/0046273 A1 | 2/2010 | Azuma et al. | |
| 2012/0140544 A1 | 6/2012 | Kim | |
| 2012/0243294 A1 | 9/2012 | Kaneko et al. | |
| 2013/0170283 A1 | 7/2013 | Lan et al. | |
| 2013/0201750 A1 | 8/2013 | Lee et al. | |
| 2013/0235648 A1 | 9/2013 | Kim et al. | |
| 2014/0241034 A1 | 8/2014 | Tsai et al. | |

FOREIGN PATENT DOCUMENTS

| | | |
|---|---|---|
| CN | 102099863 | 6/2011 |
| TW | I419172 | 12/2013 |
| TW | 201419279 | 5/2014 |

OTHER PUBLICATIONS

"Office Action of Taiwan Counterpart Application," issued on Apr. 18, 2016, p. 1-p. 4.
Meng-Hung Lin, et al., "Resistive Memory and Repairing Method Thereof," Unpublished U.S. Appl. No. 14/729,065, filed Jun. 3, 2015.

* cited by examiner

*Primary Examiner* — Son Mai
(74) *Attorney, Agent, or Firm* — Jianq Chyun IP Office

(57) ABSTRACT

A writing method for a resistive memory apparatus is provided. In the method, logic data is received, and a corresponding selection memory cell is selected. A logic level of the logic data is determined. When the logic data is at a first logic level, a RESET pulse is provided to the selection memory cell and then a SET pulse smaller than a reference write current and having a near-rectangular pulse width is provided to the selection memory cell during a writing period. When the logic data is at a second logic level, the RESET pulse is provided to the selection memory cell and then a SET pulse larger than the reference write current and having the near-rectangular pulse width is provided to the selection memory cell during the writing period.

10 Claims, 3 Drawing Sheets

WRITING METHOD FOR RESISTIVE MEMORY APPARATUS

CROSS-REFERENCE TO RELATED APPLICATION

This application claims the priority benefit of Taiwan application serial no. 104119566, filed on Jun. 17, 2015. The entirety of the above-mentioned patent application is hereby incorporated by reference herein and made a part of this specification.

BACKGROUND OF THE INVENTION

Field of the Invention

The invention relates to a data writing method and more particularly relates to a writing method for a resistive memory apparatus.

Description of Related Art

A non-volatile memory can retain the data stored therein even when the power is off, and therefore has become an essential memory element for the normal operation of various electronic products. Resistive random access memory (RRAM) is a type of the non-volatile memory that manufacturers in this field are zealous to develop, which has advantages, such as low operation voltage for writing, short writing/erasing time, long memory time, non-destructive reading, multi-state memory, simple structure, and small area, and has great potential to be applied to personal computers and electronic equipment.

For the resistive memory, generally, the width of the filament path may be changed by the pulse voltage applied and the polarity. Thereby, the resistance value is set to a low resistance state (LRS) or a high resistance state (HRS) in a reversible and non-volatile way for respectively representing the stored data of different logic levels. For example, a RESET pulse may be applied to narrow the width of the filament path to form the high resistance state when the data logic 1 is written. In addition, a SET pulse having the opposite polarity may be applied to increase the width of the filament path to form the low resistance state when the data logic 0 is written. Accordingly, during data reading, the data of logic 1 or logic 0 may be read according to the read currents with different ranges that are generated under different resistance states.

However, the filament path in the variable resistance element may be affected by the high-temperature environment and become unstable, which challenges the data retention of the variable resistance element. More specifically, the low resistance state may have an increasing resistance value due to the high-temperature environment and the high resistance state may have a decreasing resistance value due to the high-temperature environment. In such a situation, the ranges of the read currents respectively corresponding to the two resistance states may overlap each other. Consequently, during the data reading, the stored data of different logic levels may generate the same read current and cause the stored data to be read incorrectly.

SUMMARY OF THE INVENTION

The invention provides a writing method for a resistive memory apparatus, by which a write operation for data of different logic levels is performed using set pulses that have the same polarity and different magnitudes or different pulse widths, so as to prevent overlap of the ranges of read currents in a high-temperature environment.

In the writing method of the resistive memory apparatus of the invention, logic data is received and a corresponding selection memory cell is selected. A logic level of the logic data is determined. When the logic data is at a first logic level, a reset pulse is provided to the selection memory cell and then a set pulse, which is smaller than a reference write current and has a near-rectangular pulse width, is provided to the selection memory cell during a writing period. When the logic data is at a second logic level, the reset pulse is provided to the selection memory cell and then a set pulse, which is larger than the reference write current and has the near-rectangular pulse width, is provided to the selection memory cell during the writing period.

In the writing method of the resistive memory apparatus of the invention, logic data is received and a corresponding selection memory cell is selected. A logic level of the logic data is determined. When the logic data is at a first logic level, the reset pulse is provided to the selection memory cell and then a set pulse, which is larger than a reference write current and has a narrow-peak pulse width, is provided to the selection memory cell during a writing period. When the logic data is at a second logic level, the reset pulse is provided to the selection memory cell and then a set pulse, which is larger than the reference write current and has a near-rectangular pulse width, is provided to the selection memory cell during the writing period.

Based on the above, in the writing method of the resistive memory apparatus of the invention, when data of different logic levels is received, the data write operation is performed by using set pulses that have the same polarity and different magnitudes or different pulse widths. During the data reading, the stored data is read correctly through setting of the specific read current range. Accordingly, in the high-temperature environment, the read current ranges respectively corresponding to the low resistance state and the high resistance state do not overlap each other and an error in determining the logic level during the data reading is prevented.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
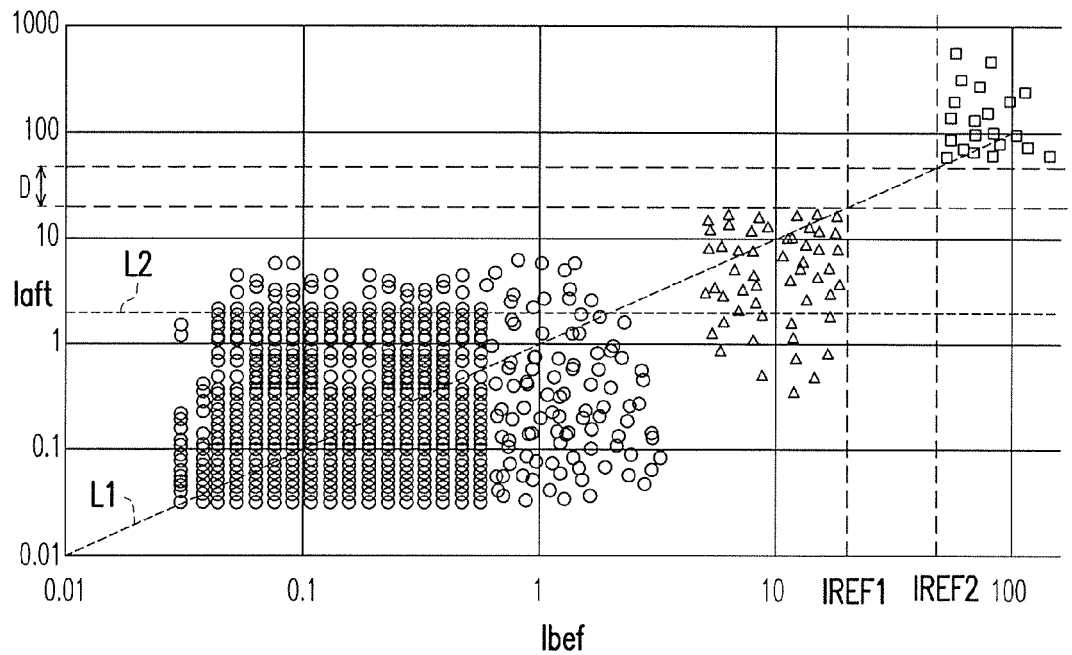
FIG. 1 is a diagram showing the relationship between the read currents before and after the temperature rises according to an embodiment of the invention.

FIG. 1 is a diagram showing the relationship between read currents before and after the temperature rises according to an embodiment of the invention. With reference to FIG. 1, the horizontal axis of FIG. 1 represents a read current Ibef (in the unit of mA) generated by a resistive memory during reading of data before the temperature rises (at room temperature) and the vertical axis represents a read current Iaft (in the unit of mA) generated by the resistive memory during reading of the data after the temperature rises (e.g. up to 260 degrees Celsius). The circular, triangular, and square marking points in FIG. 1 respectively indicate the relationship between the corresponding read currents Ibef and Iaft before and after the temperature rises after data is written via a RESET pulse or a SET pulse. Specifically, the circular marking point indicates the read current when the RESET pulse is applied. The triangular and square marking points respectively indicate the read currents when different SET pulses are applied.

With reference to FIG. 1, traditionally, the resistive memory may be applied with the RESET pulse to form a high resistance state, so as to store data of logic 1, for example. The SET pulse having a polarity opposite to the RESET pulse may be applied to form a low resistance state, so as to store data of logic 0, for example. Accordingly, when the data is read, the read currents that correspond to different resistance states may be used to determine the resistance state, thereby correctly reading the data of logic 1 or logic 0. However, a filament path may be affected by the temperature in a high-temperature environment, which results in variation in the read current to be used for reading the data. As shown in FIG. 1, the marking points are not completely distributed along the dotted line L1 which represents that the read currents Ibef and Iaft are the same between before and after the temperature rises. It is known from FIG. 1 that the same read current Iaft on the dotted line L2 corresponds to both the read currents Ibef of the low resistance state (circular marking point) and the high resistance state (triangular marking point), which causes that the resistance state cannot be correctly determined through the read current and results in an error in reading the stored data.

However, according to FIG. 1, it is found that the triangular and square marking points of different SET pulses have apparently different distribution ranges. The triangular marking point representing that the read current Ibef is smaller than a reference current IREF1 (20 uA, for example) has a distribution range from the dotted line L1 toward the left lower side. However, the square marking point representing that the read current Ibef is larger than a reference current IREF2 (25 uA, for example) has a distribution range from the dotted line L1 toward the right upper side. It is inferred from the above that the read currents Iaft, which correspond to the aforementioned two states indicated by the triangular and square marking points, have a significant interval D therebetween and do not overlap each other in the high-temperature environment. Accordingly, the resistive memory apparatus and the writing method thereof provided by an embodiment of the invention utilize the distribution characteristic shown in FIG. 1 (the characteristic that the read currents of the SET pulse do not overlap in the specific read current range even in the high-temperature environment) and achieve the data writing method that copes with the high-temperature environment. How to embody the writing method for the resistive memory apparatus disclosed in an embodiment of the invention is explained below.

Figure 2:
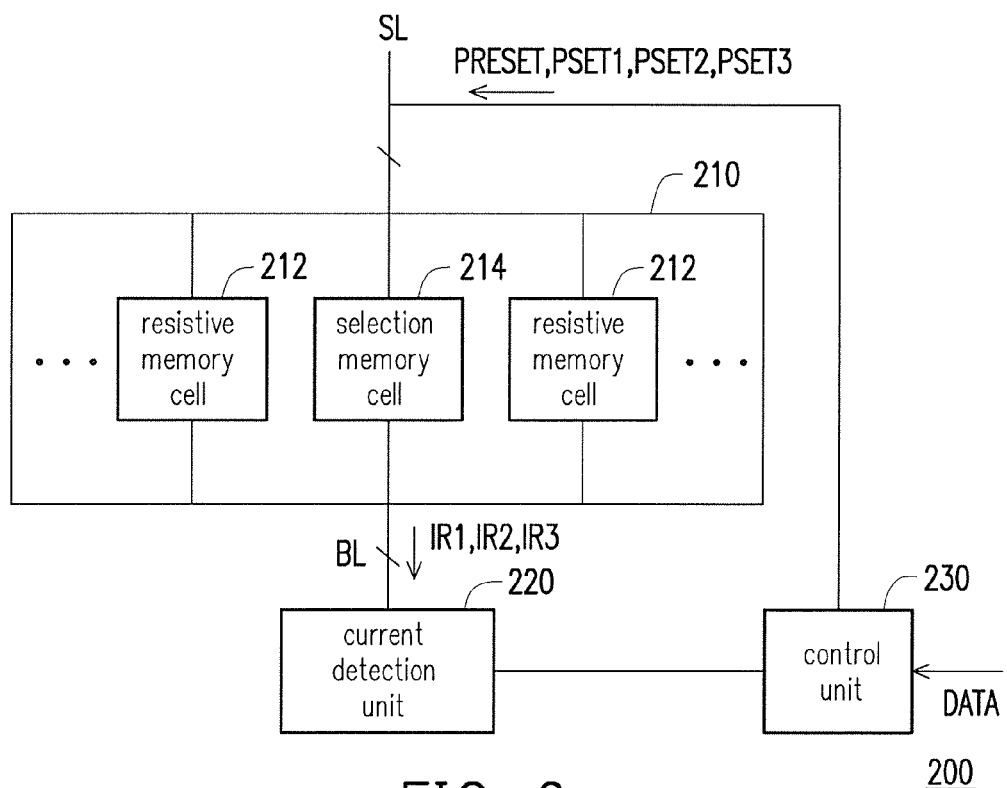
FIG. 2 is a schematic diagram of the resistive memory apparatus according to an embodiment of the invention.

FIG. 2 is a schematic diagram of the resistive memory apparatus according to an embodiment of the invention. With reference to FIG. 2, a resistive memory apparatus 200 includes a resistive memory cell array 210, a current detection unit 220, and a control unit 230. The resistive memory cell array 210 includes a plurality of resistive memory cells 212. The resistive memory cell array 210 is coupled to the current detection unit 220 via a plurality of bit lines BL and coupled to the control unit 230 via a plurality of source lines SL. Each resistive memory cell 212 includes a switch element, such as a metal oxide semiconductor field effect transistor or a bipolar junction transistor, and a variable resistance element. Each resistive memory cell 212 provides stored data of one bit.

The current detection unit 220 may be any type of current measuring element/circuit, such as a sense amplifier circuit. The current detection unit 220 is coupled to the resistive memory cells 212 via the bit lines BL and detects currents generated by the resistive memory cells 212.

The control unit 230 is a central processing unit (CPU), a microprocessor, a digital signal processor (DSP), a programmable controller, a programmable logic device (PLD), other similar devices, or a combination of the foregoing, for example. The control unit 230 is coupled to the current detection unit 220 and the source lines SL of the resistive memory cell array 210. Steps of the data writing method for the resistive memory apparatus 200 in this embodiment are described in detail below.

Figure 3:
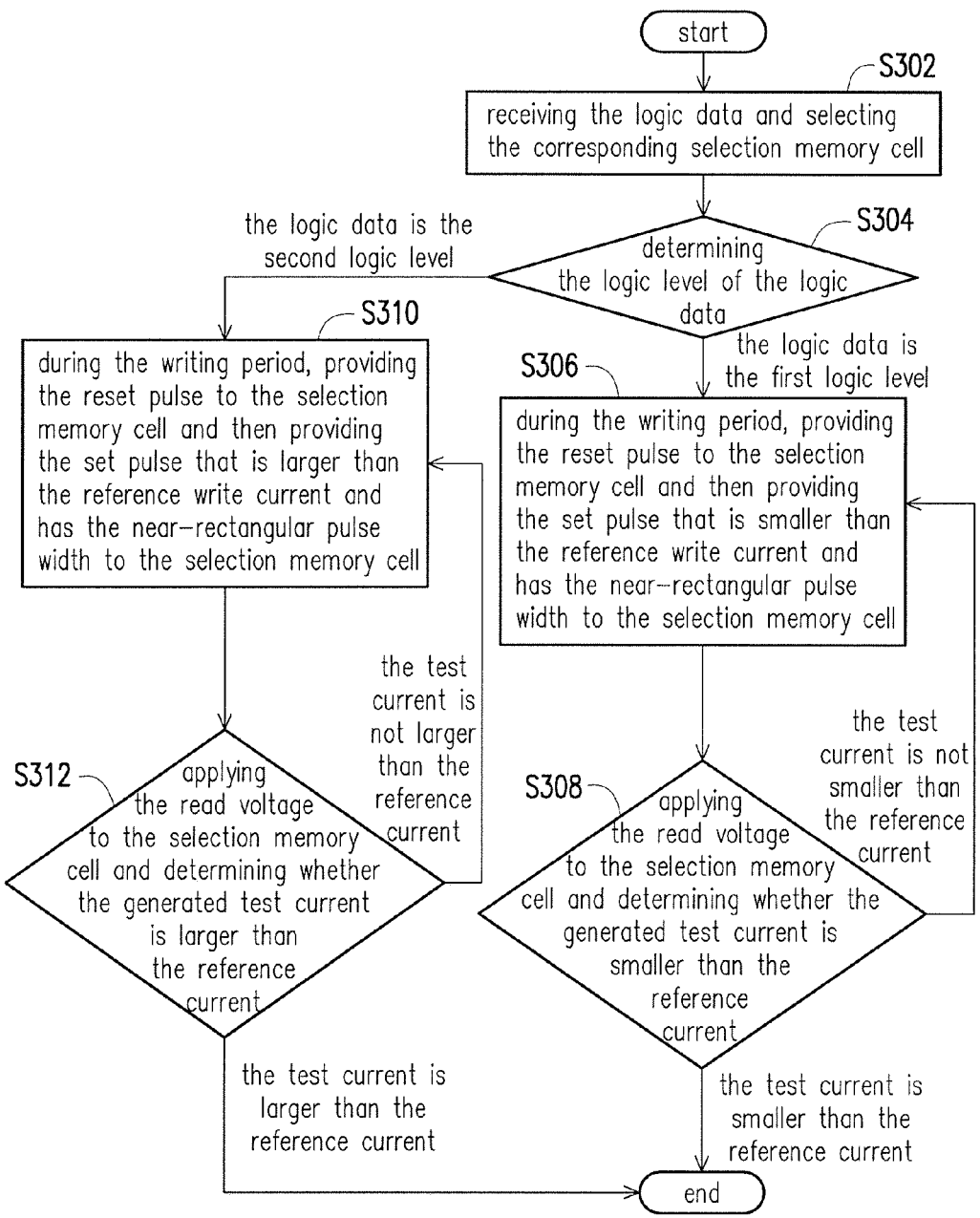
FIG. 3 is a flowchart showing the writing method for the resistive memory apparatus according to an embodiment of the invention.

FIG. 3 is a flowchart showing the writing method for the resistive memory apparatus according to an embodiment of the invention. With reference to FIG. 2 and FIG. 3, the writing method of the logic data of this embodiment is suitable for the resistive memory apparatus 200 of FIG. 2. Steps of the writing method of this embodiment are explained below respectively with reference to the components of the resistive memory apparatus 200.

In Step S302, the control unit 230 receives logic data DATA and selects a corresponding selection memory cell 214. Specifically, when the control unit 230 receives the logic data DATA of one bit, the control unit 230 selects one corresponding selection memory cell 214 from a plurality of resistive memory cells 212. The selection memory cell 214 includes a switch element and a variable resistance element. For example, the control unit 230 provides a selection voltage to a gate (or a base) of a transistor that serves as the switch element in the selection memory cell 214 to turn on the selection memory cell 214, so as to perform a data write operation on the selection memory cell 214.

In Step S304, the control unit 230 determines a logic level of the logic data DATA. Specifically, the control unit 230 deter mines whether the logic data DATA of one bit is logic 1 or logic 0.

If the logic data DATA is logic 1 (first logic level), in Step S306, the control unit 230 first provides a reset pulse PRESET to the selection memory cell 214 and then provides a set pulse PSET1 to the selection memory cell 214 during a writing period of the data. The set pulse PSET1 has a polarity opposite to the reset pulse PRESET, and a current value of the set pulse PSET1 is smaller than a reference write current, which is 100 uA, for example. The set pulse PSET1 has a specific near-rectangular pulse width (the near-rectangular pulse width is 100 nanoseconds, for example), such that the set pulse PSET1 renders the selection memory cell 214 the high resistance state (HRS). Specifically, the variable resistance element of the selection memory cell 214 is an oxide-based resistive random access memory, for example. When the selection memory cell 214 reaches the high resistance state for writing the data of logic 1, the control unit 230 first provides the reset pulse PRESET having the polarity opposite to the set pulse PSET1 to the selection memory cell 214 via the source line SL to narrow the width of the filament path in the variable resistance element, so as to reset (raise) the resistance value of the variable resistance element. Then, the control unit 230 provides the set pulse PSET1, which is smaller than the reference write current and has the specific near-rectangular pulse width of about 100 nanoseconds, for example, to the variable resistance element of the selection memory cell 214 via the source line SL. Thereby, the width of the filament path in the variable resistance element is adjusted such that when a proper read voltage is applied to the selection memory cell 214, a read current IR1 smaller than the reference current IREF is generated. For example, in the case where the read voltage is 0.2V, the reference current IREF is 10-20 uA. Nevertheless, the invention is not limited thereto.

Next, in order to ensure that the read current falls in the specific read current range after the data is written, in Step S308, the control unit 230 applies the read voltage to the selection memory cell 214 and determines whether a generated test current is smaller than the reference current IREF. Specifically, after the control unit 230 provides the set pulse PSET1 to the selection memory cell 214 for writing logic 1, in order to prevent an error that is generated when the filament path is not adjusted to the expected width, the control unit 230 applies the read voltage to the selection memory cell 214 for the current detection unit 220 to detect the generated test current first. The control unit 230 determines whether the test current is smaller than the reference current IREF according to the detection result of the current detection unit 220.

If the test current is not smaller than the reference current IREF, it indicates that the width of the filament path of the variable resistance element may be overly large. Thus, the procedure returns to Step S306, and the control unit 230 provides the reset pulse PRESET to the selection memory cell 214 and then provides the set pulse PSET1, which is smaller than the reference write current and has the near-rectangular pulse width, to the selection memory cell 214 again, so as to adjust the width of the filament path again. Thereafter, the procedure returns to Step S308 to perform the test again until the test current falls in the specific read current range (smaller than the reference current IREF).

Thereby, during the reading, when the control unit 230 applies the read voltage to the selection memory cell 214, the current detection unit 220 accurately detects the read current IR1 smaller than the reference current IREF. Moreover, the current detection unit 220 transmits the detection result to the control unit 230, and the control unit 230 determines that the selection memory cell 214 is in the high resistance state according to the read current range smaller than the reference current IREF, so as to read the data of logic 1.

On the other hand, if the logic data DATA is logic 0 (second logic level), in Step S310, the control unit 230 first provides the reset pulse PRESET to the selection memory cell 214 and then provides a set pulse PSET2 to the selection memory cell 214 during the writing period of the data. The set pulse PSET2 has the polarity opposite to the reset pulse PRESET, and the current value of the set pulse PSET2 is larger than the reference write current, which is 100 uA, for example. The set pulse PSET2 also has the specific near-rectangular pulse width (the near-rectangular pulse width is 100 nanoseconds, for example), such that the set pulse PSET2 renders the selection memory cell 214 to the low resistance state (LRS). Specifically, when the selection memory cell 214 reaches the low resistance state for writing the data of logic 0, the control unit 230 first provides the reset pulse PRESET having the polarity opposite to the set pulse PSET2 to the selection memory cell 214 via the source line SL to narrow the width of the filament path in the variable resistance element, so as to reset (raise) the resistance value of the variable resistance element. Then, the control unit 230 provides the set pulse PSET2, which is larger than the reference write current and has the near-rectangular pulse width of about 100 nanoseconds, for example, to the variable resistance element of the selection memory cell 214 via the source line SL. Thereby, the width of the filament path in the variable resistance element is adjusted such that when a proper read voltage (0.2V, for example) is applied to the selection memory cell 214, a read current IR2 larger than the reference current IREF (10-20 uA, for example) is generated. Moreover, in this embodiment, because the read current range corresponding to the set pulse PSET2 is higher than the read current range corresponding to the set pulse PSET1, the set pulse PSET2 is higher than the set pulse PSET1 and the set pulses PSET1 and PSET2 have the same polarity.

Next, in order to ensure that the read current falls in the specific read current range after data writing, in Step S312, the control unit 230 applies the read voltage to the selection memory cell 214 and determines whether the generated test current is larger than the reference current IREF. Specifically, after the control unit 230 provides the set pulse PSET2 to the selection memory cell 214 for writing logic 0, in order to prevent an error that is generated when the filament path is not adjusted to the expected width, the control unit 230 applies the read voltage to the selection memory cell 214 for the current detection unit 220 to detect the generated test current first. The control unit 230 determines whether the test current is larger than the reference current IREF according to the detection result of the current detection unit 220.

If the test current is not larger than the reference current IREF, it indicates that the width of the filament path of the variable resistance element may be overly narrow. Thus, the procedure returns to Step S310, and the control unit 230 provides the reset pulse PRESET to the selection memory cell 214 and provides the set pulse PSET2, which is larger than the reference write current and has the near-rectangular pulse width, to the selection memory cell 214 again, so as to adjust the width of the filament path again. Thereafter, the procedure returns to Step S312 to perform the test again until the test current falls in the specific read current range (larger than the reference current IREF).

Thereby, during the reading, when the control unit 230 applies the read voltage to the selection memory cell 214, the current detection unit 220 accurately detects the read current IR2 larger than the reference current IREF. Moreover, the current detection unit 220 transmits the detection result to the control unit 230, and the control unit 230 determines that the selection memory cell 214 is in the low resistance state according to the read current range larger than the reference current IREF, so as to read the data of logic 0. It should be noted that this embodiment of the invention is not intended to limit the logic data represented by different read current ranges. In an embodiment, the control unit 230 may determine that the data of logic 0 is read according to the read current range smaller than the reference current IREF and that the data of logic 1 is read according to the read current range larger than the reference current IREF.

Therefore, by performing the writing method of the embodiment of the invention, when the set pulses PSET1 and PSET2 corresponding to the specific read current ranges (smaller or larger than the reference current IREF) are used to write data of different logic levels, even in the high-temperature environment, the selection memory cell 214 may respectively generate the read current corresponding to logic 0 or logic 1 within read current ranges that do not overlap, so as to prevent an error in determining the logic level of the stored data.

In an embodiment, the control unit 230 may adjust the resistance value of the variable resistance element of the selection memory cell 214 to 0 (causing short circuit at two ends of the variable resistance element, for example) and apply the read voltage to the selection memory cell 214 to generate the reference write current corresponding to the selection memory cell 214.

Figure 4:
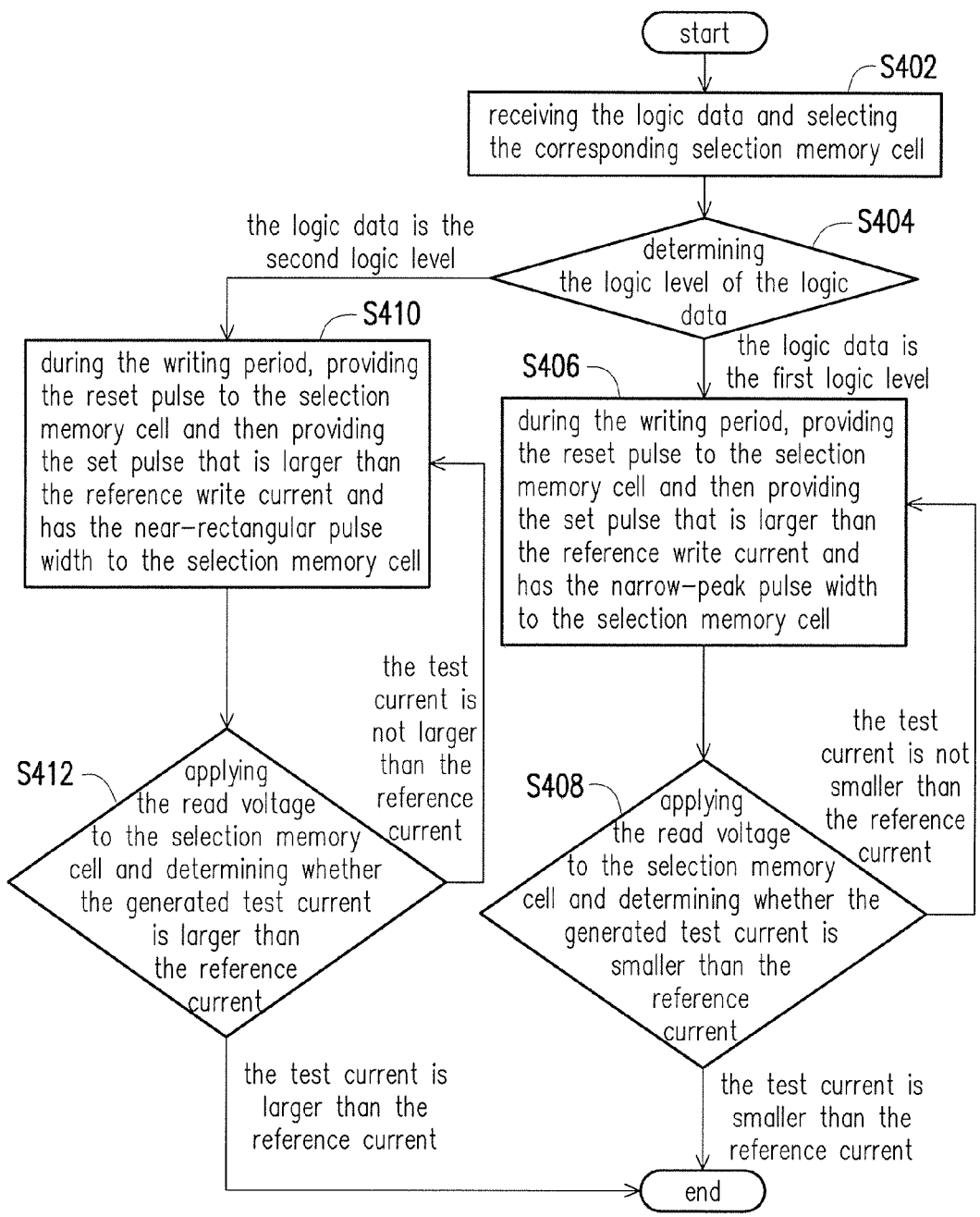
FIG. 4 is a flowchart showing the writing method for the resistive memory apparatus according to an embodiment of the invention.

FIG. 4 is a flowchart showing the writing method for the resistive memory apparatus according to an embodiment of the invention. With reference to FIG. 2 and FIG. 4, the writing method of the logic data of this embodiment is suitable for the resistive memory apparatus 200 of FIG. 2. Steps of the writing method of this embodiment are explained below respectively with reference to the components of the resistive memory apparatus 200.

In Step S402, the control unit 230 receives logic data DATA and selects the corresponding selection memory cell 214. In Step S404, the control unit 230 determines the logic level of the logic data DATA. Steps S402 and S404 are the same as or similar to Steps S302 and S304 of the above embodiment. Thus, details thereof are not repeated hereinafter.

A difference between the above embodiment and this embodiment is that, in this embodiment, when the logic data DATA is logic 1 (the first logic level), in Step S406, the control unit 230 first provides the reset pulse PRESET to the selection memory cell 214 and then provides a set pulse PSET3 to the selection memory cell 214. The set pulse PSET3 has a polarity opposite to the reset pulse PRESET, and a current value of the set pulse PSET3 is larger than the reference write current, which is 100 uA, for example. The set pulse PSET3 has a specific narrow-peak pulse width (the narrow-peak pulse width is 10 nanoseconds, for example), such that the set pulse PSET3 renders the selection memory cell 214 the high resistance state (HRS). Specifically, when the selection memory cell 214 reaches the high resistance state for writing the data of logic 1, the control unit 230 first provides the reset pulse PRESET having the polarity opposite to the set pulse PSET3 to the selection memory cell 214 via the source line SL to narrow the width of the filament path in the variable resistance element, so as to reset (raise) the resistance value of the variable resistance element. Then, the control unit 230 provides the set pulse PSET3, which is larger than the reference write current and has the narrow-peak pulse width of about 10 nanoseconds, for example, to the variable resistance element of the selection memory cell 214 via the source line SL. Thereby, the width of the filament path in the variable resistance element is adjusted such that when a proper read voltage (0.2V, for example) is applied to the selection memory cell 214, a read current IR3 smaller than the reference current IREF (10-20 uA, for example) is generated.

Next, in order to ensure that the read current falls in the specific read current range after the data is written, in Step S408, the control unit 230 applies the read voltage to the selection memory cell 214 and determines whether the generated test current is smaller than the reference current IREF. Specifically, after the control unit 230 provides the set pulse PSET3 to the selection memory cell 214 for writing logic 1, in order to prevent an error that is generated when the filament path is not adjusted to the expected width, the control unit 230 applies the read voltage to the selection memory cell 214 for the current detection unit 220 to detect the generated test current first. The control unit 230 determines whether the test current is smaller than the reference current IREF according to the detection result of the current detection unit 220.

If the test current is not smaller than the reference current IREF, it indicates that the width of the filament path of the variable resistance element may be overly large. Thus, the procedure returns to Step S406, and the control unit 230 provides the reset pulse PRESET to the selection memory cell 214 and provides the set pulse PSET3, which is larger than the reference write current and has the narrow-peak pulse width, to the selection memory cell 214 again, so as to adjust the width of the filament path again. Thereafter, the procedure returns to Step S408 to perform the test again until the test current falls in the specific read current range (smaller than the reference current IREF).

Thereby, during the reading, when the control unit 230 applies the read voltage to the selection memory cell 214, the current detection unit 220 accurately detects the read current IR3 smaller than the reference current IREF. Moreover, the current detection unit 220 transmits the detection result to the control unit 230, and the control unit 230 determines that the selection memory cell 214 is in the high resistance state according to the read current range smaller than the reference current IREF, so as to read the data of logic 1.

On the other hand, if the logic data DATA is logic 0 (second logic level), in Step S410, the control unit 230 first provides the reset pulse PRESET to the selection memory cell 214 and then provides the set pulse PSET2 to the selection memory cell 214 during the writing period of the data. The set pulse PSET2 has the polarity opposite to the reset pulse PRESET, and the current value of the set pulse PSET2 is larger than the reference write current, which is 100 uA, for example. The set pulse PSET2 has the specific near-rectangular pulse width (the near-rectangular pulse width is 100 nanoseconds, for example), such that the set pulse PSET2 renders the selection memory cell 214 to the low resistance state (LRS). Thereby, the width of the filament path in the variable resistance element is adjusted such that when the read voltage (0.2V, for example) is applied to the selection memory cell 214, the read current IR2 larger than the reference current IREF (10-20 uA, for example) is generated.

Next, in Step S412, the control unit 230 applies the read voltage to the selection memory cell 214 and determines whether the generated test current is larger than the reference current IREF. If the test current is not larger than the reference current IREF, it indicates that the width of the filament path of the variable resistance element may be overly narrow. Thus, the procedure returns to Step S410, and the control unit 230 provides the reset pulse PRESET to the selection memory cell 214 and then provides the set pulse PSET2, which is larger than the reference write current and has the near-rectangular pulse width, to the selection memory cell 214 again, so as to adjust the width of the filament path again. Thereafter, the procedure returns to Step S412 to perform the test again until the test current falls in the specific read current range (larger than the reference current IREF).

Thereby, during the reading, when the control unit 230 applies the read voltage to the selection memory cell 214, the current detection unit 220 accurately detects the read current IR2 larger than the reference current IREF. Then, the control unit 230 determines that the selection memory cell 214 is in the low resistance state according to the read current range larger than the reference current IREF, so as to read the data of logic 0. Even in the high-temperature environment, the selection memory cell 214 may respectively generate the read current corresponding to logic 0 or logic 1 within read current ranges that do not overlap. Thus, an error in determining the logic level of the stored data may be prevented.

To conclude the above, in the writing method of the resistive memory apparatus of the invention, the write operation for data of different logic levels is performed by using set pulses that have the same polarity and different magnitudes or different pulse widths. During data reading, the stored data is read correctly through setting of the specific read current range. Accordingly, in the high-temperature environment, the read current ranges respectively corresponding to the low resistance state and the high resistance state do not overlap each other and an error in determining the logic level during data reading is prevented.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A writing method for a resistive memory apparatus, the writing method comprising:
   receiving logic data and selecting a corresponding selection memory cell;
   determining a logic level of the logic data;
   providing a reset pulse to the selection memory cell and then providing a set pulse that is smaller than a reference write current and has a near-rectangular pulse width to the selection memory cell during a writing period when the logic data is at a first logic level; and
   providing the reset pulse to the selection memory cell and then providing a set pulse that is larger than the reference write current and has the near-rectangular pulse width to the selection memory cell during the writing period when the logic data is at a second logic level.

2. The writing method according to claim 1, wherein the selection memory cell comprises a variable resistance element, and before the step of receiving the logic data, the writing method further comprises:
   adjusting a resistance value of the variable resistance element to 0 and applying a read voltage to the selection memory cell to generate the reference write current.

3. The writing method according to claim 1, wherein after the step of providing the set pulse that is smaller than the reference write current and has the near-rectangular pulse width to the selection memory cell, the writing method further comprises:
   applying a read voltage to the selection memory cell and determining whether a generated test current is smaller than a reference current; and
   providing the reset pulse to the selection memory cell and then providing the set pulse that is smaller than the reference write current and has the near-rectangular pulse width to the selection memory cell again when the test current is not smaller than the reference current.

4. The writing method according to claim 1, wherein after the step of providing the set pulse that is larger than the reference write current and has the near-rectangular pulse width to the selection memory cell, the writing method further comprises:
   applying a read voltage to the selection memory cell and determining whether a generated test current is larger than a reference current; and
   providing the reset pulse to the selection memory cell and then providing the set pulse that is larger than the reference write current and has the near-rectangular pulse width to the selection memory cell again when the test current is not larger than the reference current.

5. The writing method according to claim 1, wherein the reference write current is 100 uA and the near-rectangular pulse width is 100 nanoseconds.

6. A writing method for a resistive memory apparatus, the writing method comprising:
   receiving logic data and selecting a corresponding selection memory cell;
   determining a logic level of the logic data;
   providing a reset pulse to the selection memory cell and then providing a set pulse that is larger than a reference write current and has a narrow-peak pulse width to the selection memory cell during a writing period when the logic data is at a first logic level; and
   providing the reset pulse to the selection memory cell and then providing a set pulse that is larger than the reference write current and has a near-rectangular pulse width to the selection memory cell during the writing period when the logic data is at a second logic level.

7. The writing method according to claim 6, wherein the selection memory cell comprises a variable resistance element, and before the step of receiving the logic data, the writing method further comprises:
   adjusting a resistance value of the variable resistance element to 0 and applying a read voltage to the selection memory cell to generate the reference write current.

8. The writing method according to claim 6, wherein after the step of providing the set pulse that is larger than the reference write current and has the narrow-peak pulse width to the selection memory cell, the writing method further comprises:
   applying a read voltage to the selection memory cell and determining whether a generated test current is smaller than a reference current; and
   providing the reset pulse to the selection memory cell and then providing the set pulse that is larger than the reference write current and has the narrow-peak pulse width to the selection memory cell again when the test current is not smaller than the reference current.

9. The writing method according to claim 6, wherein after the step of providing the set pulse that is larger than the reference write current and has the near-rectangular pulse width to the selection memory cell, the writing method further comprises:
   applying a read voltage to the selection memory cell and determining whether a generated test current is larger than a reference current; and
   providing the reset pulse to the selection memory cell and then providing the set pulse that is larger than the reference write current and has the near-rectangular pulse width to the selection memory cell again when the test current is not larger than the reference current.

10. The writing method according to claim 6, wherein the reference write current is 100 uA, the narrow-peak pulse width is 10 nanoseconds, and the near-rectangular pulse width is 100 nanoseconds.

* * * * *